United States Patent [19]

Engel et al.

[11] Patent Number: 5,017,859
[45] Date of Patent: May 21, 1991

[54] INTEGRAL CAPACITIVE DIVIDER BUS BAR VOLTAGE MEASURING APPARATUS AND COMBINED CURRENT SENSOR

[75] Inventors: Joseph C. Engel, Monroeville Boro, Pa.; Denis A. Mueller, Asheville, N.C.; Allan I. Bennett, Murrysville Boro, Pa.

[73] Assignee: Westinghouse Electric Corp., Pittsburgh, Pa.

[21] Appl. No.: 389,097

[22] Filed: Aug. 3, 1989

[51] Int. Cl.$^5$ .......................... G01R 15/04; H01G 3/00
[52] U.S. Cl. ..................................... 324/127; 324/126; 361/302
[58] Field of Search ................... 324/126, 127, 133; 336/174, 175; 174/142, 143; 361/302

[56] References Cited

U.S. PATENT DOCUMENTS

| | | | |
|---|---|---|---|
| 3,271,509 | 9/1966 | Calderwood et al. | 174/143 |
| 3,538,440 | 11/1970 | Galloway | 324/126 |
| 3,769,447 | 10/1973 | Quirk et al. | 174/143 |
| 4,074,193 | 2/1978 | Kohler | 174/143 |
| 4,090,130 | 5/1978 | Willenbacher, Jr. | 324/126 |
| 4,325,022 | 2/1982 | Pelletier | 324/127 |

Primary Examiner—Kenneth Wieder
Assistant Examiner—Vinh P. Nguyen
Attorney, Agent, or Firm—G. H. Telfer

[57] ABSTRACT

The first capacitor of a capacitive divider adapted for measuring the voltage on a bus bar utilizes the bus bar as one plate, the normal insulation provided on the bus bar as the dielectric and a first conductive layer applied over the insulation as the second plate. While a separate capacitor can be used for the second capacitor of the capacitive divider, preferably the first conductive layer serves as a common plate for both capacitors, with a second insulation layer applied over the first conductive layer forming the dielectric of the second capacitor, and a second conductive layer applied over the second insulation layer serving as the second plate which is grounded. The voltage on the common plate formed by the first conductive layer is applied to a voltmeter to provide a voltage reading proportional to the voltage on the bus bar. A particularly simple, compact combined voltage and current sensor is provided by aligning a mutual inductor current sensor with the integral capacitive divider so that the outer conductive layer of the capacitive divider serves a voltage shield for the current sensor.

7 Claims, 4 Drawing Sheets

INTEGRAL CAPACITIVE DIVIDER BUS BAR VOLTAGE MEASURING APPARATUS AND COMBINED CURRENT SENSOR

BACKGROUND OF THE INVENTION

1. Field of the Invention

This invention relates to apparatus for measuring voltages on bus bars and in particular to capacitive divider type voltage measuring apparatus which utilizes the bus bar as one plate, and layers of electrical insulation alternating with conductive layers to form the dielectrics and other plates for the capacitors of the capacitive divider. It also relates to such voltage measuring apparatus in combination with current measuring apparatus which utilizes the conductive layers as a voltage shield.

2. Background Information

Conventional apparatus for measuring current and voltage on medium to high voltage bus bars includes current and potential transformers providing signals to 120 volt 5 amp electromechanical devices which generate indications of the measured current and voltage. For very high voltages, where the cost of a potential transformer would be prohibitive, capacitive dividers are used to measure the voltage to ground. In such a device, a first capacitor with a very small capacitance is connected to the bus bar. A second capacitor with a much larger capacitance is then connected in series between the first capacitor and ground. The voltage across the second capacitor is proportional to and is taken as a measure of the voltage between the bus bar and ground.

Such capacitive dividers have not been used to measure other than the very high voltages because they are not compatible for use with the 120v, 5 amp electromechanical metering and protection devices which have been standard for lower voltages Particularly, the capacitive divider cannot be used with a measuring device which places a load on the divider.

Recent developments include solid state circuitry for measuring current and voltage which operates with low voltage and has a very high input impedance. Current sensing is achieved with mutual inductors which generate a signal proportional to the derivative of the sensed current. This signal is applied to an integrator which generates a signal proportional to the measured current These mutual inductors have an air core or a very low permeability powdered iron core. Hence, the signal level is very low. Shielding is provided to isolate the mutual inductor from the electric field produced by the voltage on the bus bar. This shielding includes wrapping the mutual inductor in a non-magnetic conductor such as copper foil. Alternatively, conductive paint is applied over the insulation covering the bus bar in the vicinity of the mutual inductor and grounded to form the shield. Typically, these current and voltage sensing devices are utilized with apparatus such as meters, contactors and circuit interrupters where space is limited.

There remains a need, however, for a low cost, simple, yet reliable device for measuring voltage on the bus bar.

There is a related need for such a device which can take advantage of other recent developments in the art of current and voltage measurement and can easily be retrofit to devices incorporating these developments.

More particularly, there is an additional need for such a device which can be combined with and take advantage of the improvements in current sensors.

There is also a need that such a device be compact so that it can be used in the confines of medium voltage apparatus having a requirement for voltage and current measurements.

SUMMARY OF THE INVENTION

These and other needs are satisfied by the invention in which the bus bar itself is used as one of the plates in the first of two capacitors in a capacitive divider circuit used to measure voltage on the bus bar. In addition, the electrical insulation already provided on the bus bar serves as the dielectric for the first capacitor. The second plate of the first capacitor is an electrically conductive layer or plate applied over the insulation layer. In the simplest form of the invention, a separate capacitor connected between the conductive layer and ground serves as the second capacitor of the capacitive divider. The voltage across this second capacitor is proportional to the voltage between the bus bar and ground and is measured by a voltmeter with a high input impedance.

In the preferred form of the invention, the second capacitor utilizes the conductive layer applied over the bus bar insulation layer as one plate. An additional layer of the same insulation material as is on the bus bar is applied over the conductive layer to form the dielectric for the second capacitor. A second conductive layer applied over the additional insulation layer forms the second plate for the second capacitor. Thus, in this arrangement, the bus bar serves as one plate for the first capacitor, and the first conductive layer serves as a common plate for the two capacitors. The voltage on this common plate is applied to the voltmeter. The second conductive layer which forms the second plate of the second capacitor and is connected to ground can also serve as a shield. Thus, in a particularly compact arrangement, the capacitive divider for voltage measurement is provided by the bus bar and the alternating insulation layers and conductive layers, and a mutual inductor current sensor is positioned over this capacitive divider construction with the grounded second conductive layer providing the shielding from the bus bar voltage for the mutual inductor. This very simple, compact arrangement provides an inexpensive, reliable device for measuring voltage and current in the bus bar.

By forming both capacitors of the capacitive divider on the bus bar using the same dielectric materials, the two capacitors respond proportionally to temperature and voltage effects.

In one form of the invention, the second conductive layer can comprise a conductive plate such as a copper plate. The second insulation layer is a coating applied to the plate, and the first conductive layer comprises a conductive epoxy which secures the coated conductive plate to the insulation layer on the bus bar.

BRIEF DESCRIPTION OF THE DRAWINGS

A full understanding of the invention can be gained from the following description of the preferred embodiment when read in conjunction with the accompanying drawings in which.

DESCRIPTION OF THE PREFERRED EMBODIMENTS

Figure 1:
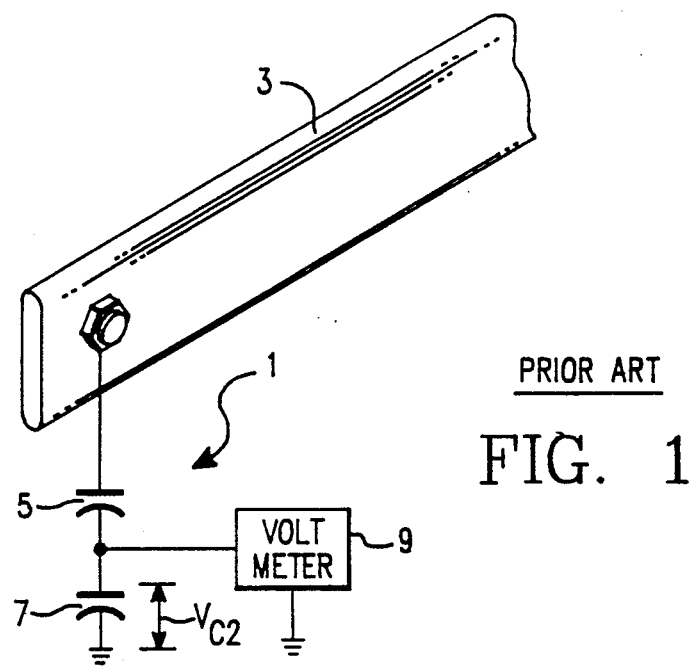
FIG. 1 is a schematic diagram illustrating capacitive divider voltage measuring apparatus of the prior art.

FIG. 1 illustrates a typical prior art capacitive divider circuit 1 used for measuring the voltage between a bus bar 3 and ground The capacitive divider 1 includes a first capacitor 5 having a capacitance $C_1$ connected to the bus bar 3, and a second capacitor 7 having a much larger capacitance $C_2$ connected in series with the first capacitor 5 between the bus bar 3 and ground. The voltage across each of the capacitors 5 and 7 is proportional to the voltage between the bus bar 3 and ground. More particularly, the voltage $V_{C2}$ across the second capacitor 7 is:

$$V_{C2} = \frac{C_1}{(C_1 + C_2)} V_B$$

where, $V_B$ is the voltage between the bus bar 3 and ground. A voltmeter 9, with a high input impedance so as not to load down capacitor 7, measures the voltage across the capacitor 7 and is scaled to generate a representation of the voltage $V_B$ on the bus bar. In installations where such a capacitive divider is used, the voltage $V_B$ between the bus bar 3 and ground is typically 30kv to 300 kv. The capacitors in this instance, especially capacitor 5, are physically very large devices.

Figure 2:
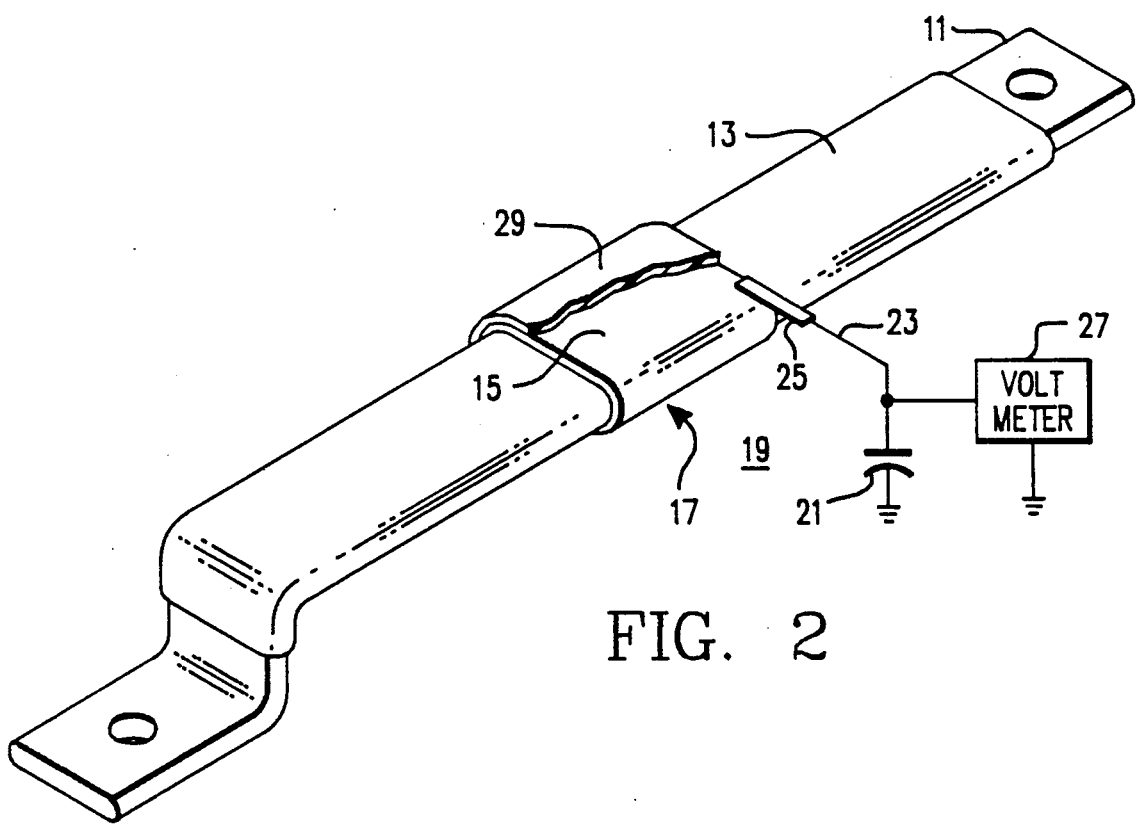
FIG. 2 is an isometric view with part cut away of a first embodiment of the voltage measuring apparatus of the invention using a discrete capacitor for the second capacitor of the capacitive divider.

FIG. 2 illustrates voltage measuring apparatus in accordance with the invention applied to a medium voltage (typically 600 v to 15 kv) bus bar 11. The particular bus bar shown has an offset in it, however, this is not a part of the invention and the bus bar can be of any configuration. The bus bar 11 is covered with an electrical insulation layer 13. Typically, an epoxy material is used for this insulation layer 13. An electrically conductive layer 15 is applied over a portion of the insulation layer 13. Typically, this conductive layer is a silver or other conductive paint In this configuration, the bus bar 11 forms the first plate of a first capacitor 17 of a capacitive divider 19. The insulation layer 13 forms the dielectric and the conductive layer 15 forms the second plate. A discrete capacitor 21 forms the second capacitor, one plate of which is grounded. A lead 23 is connected to the other plate of capacitor 21 and a copper terminal 25 secured to the conductive layer 15 as by a conductive epoxy. A high input impedance voltmeter 27 measures the voltage across the capacitor 21, which as previously explained, is proportional to the voltage between the bus 11 and ground. Preferably, a second electrical insulation layer 29 is applied over the conductive layer 15.

The voltage measuring apparatus of FIG. 2 provides measurements of the voltage on the bus bar 11 with good accuracy at lower voltages, but it has been found that as the voltage increases, the accuracy decreases. It is believed that this decrease in accuracy is due to a resistive component in the capacitor 17 formed on the bus bar. To reduce these effects, the embodiment of the invention shown in FIGS. 3 and 4 combines both capacitors on the bus bar. In this arrangement, the bus bar 11 again forms one plate, the insulation layer 13 forms the dielectric, and the conductive layer 15 forms the other plate of the first capacitor 17 of a capacitive divider 31. The conductive layer 15 in addition serves as one plate of a second capacitor 33 with a second insulation layer 35 forming the dielectric and a second conductive layer 37 serving as the second plate. The second conductive layer 37 is grounded through a terminal 39. The first conductive layer 15 is connected to the voltmeter 27 through a terminal 41 and lead 43.

Figure 3:
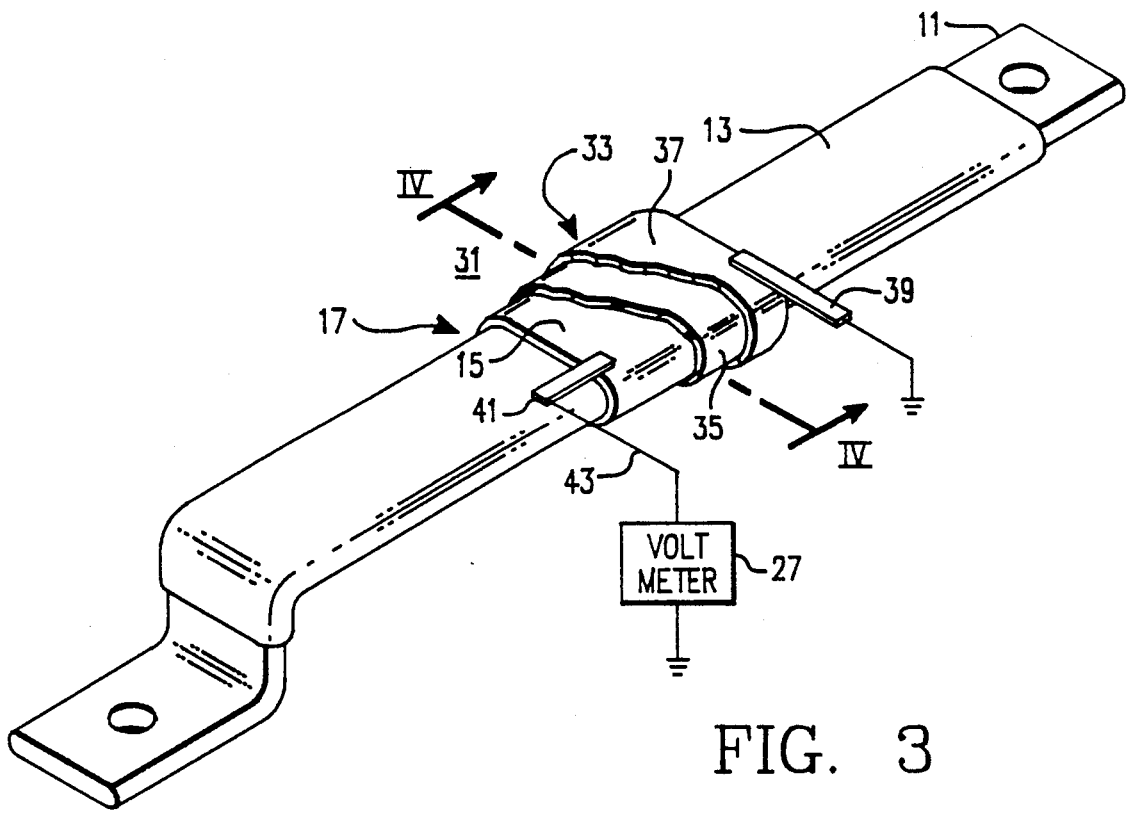
FIG. 3 is an isometric view with parts cut away of a second embodiment of the voltage measuring apparatus of the invention in which both capacitors are integrally formed on the bus bar.
Figure 4:
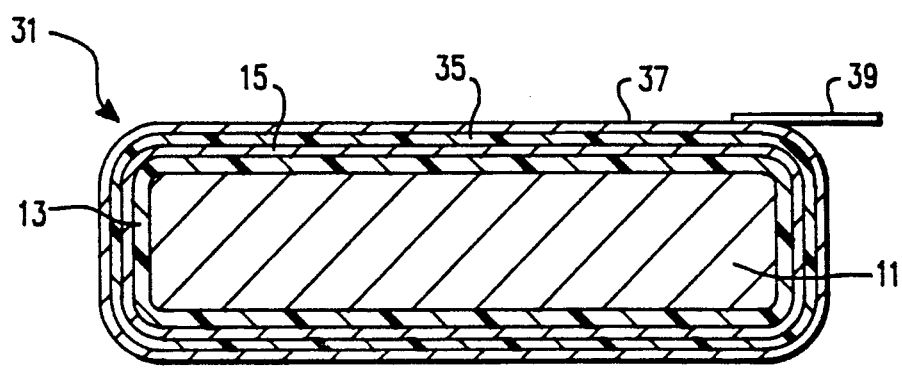
FIG. 4 is a transverse section through the voltage measuring apparatus of FIG. 3 taken along the line 4—4.

In the device of FIGS. 3 and 4, the insulation layers 13 and 35 are made of identical electrically insulating material, however, the thickness of the second insulation layer 35 is substantially less than that of the layer 13. Furthermore, preferably the second conductive layer 37 is coextensive with the first conductive layer 15 so that the effective plate areas of the two capacitors are the same. Thus, the relative capacitance of the two capacitors 17 and 33 is related inversely to the relative thickness of the dielectrics and hence the capacitance of capacitor 17 is substantially less than that of capacitor 33 so that the voltage across the capacitor 33 as measured by the voltage meter 27 is a small fraction of the voltage between the bus bar 11 and ground. In the exemplary device, the thickness of insulation layer 13 is about 20 times greater than that of insulation layer 35. It can be appreciated, therefore, that the relative thicknesses of the various layers shown in the traverse sectional view of FIG. 4 are not to scale, but are meant to show the sequence of the elements of the dual capacitors formed on the bus bar.

Figure 5:
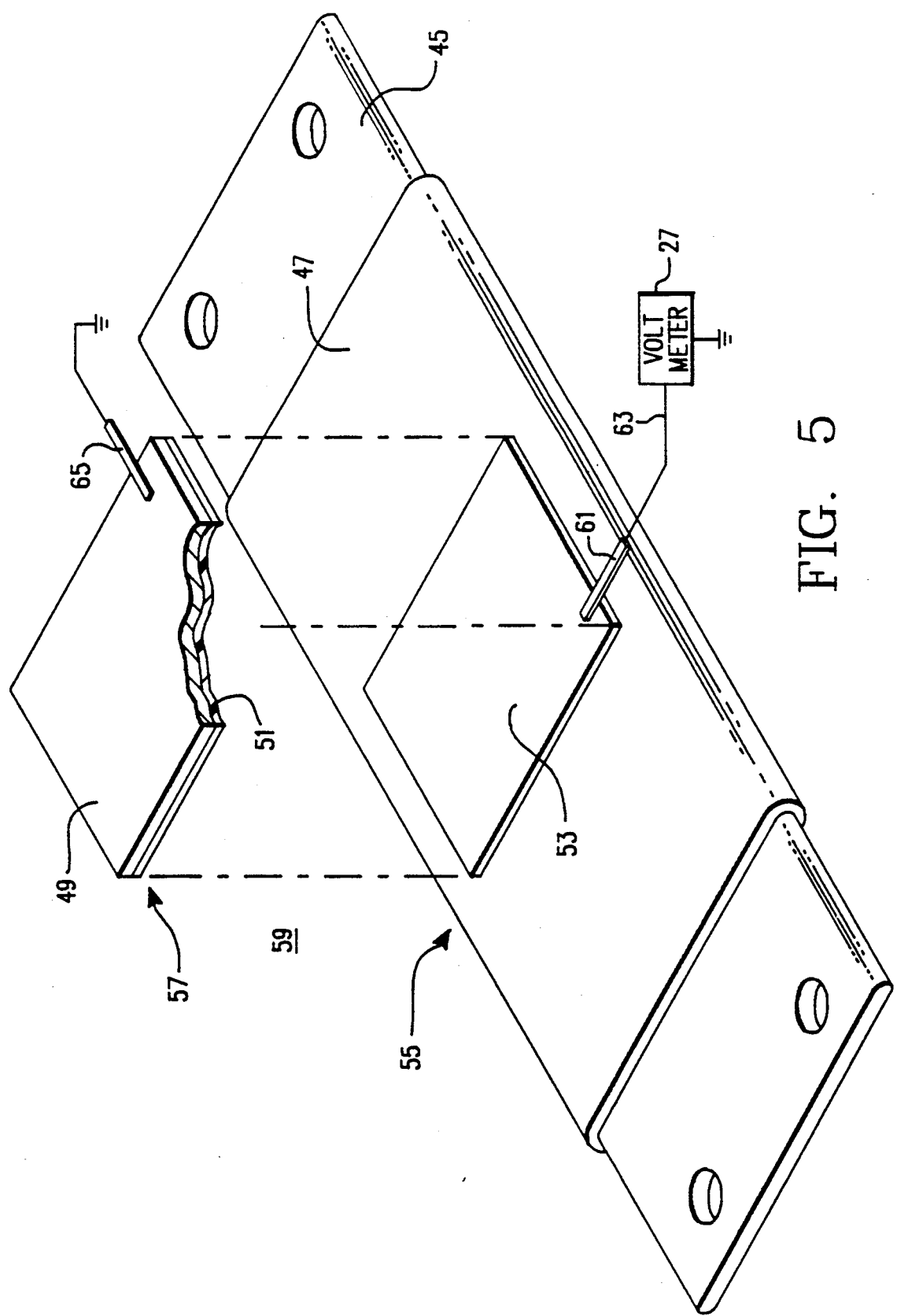
FIG. 5 is an exploded isometric view with part cut away of yet another embodiment of the voltage measuring apparatus of the invention.

FIG. 5 shows an exploded view of another embodiment of the invention applied to a wide flat bus bar 45. Again, most of the bus bar is covered with an electrical insulation layer 47 An electrically conductive plate 49, such as a sheet of copper, is coated with an electrical insulation layer 51 of the same material as the insulation layer 47. The plate 49, with the insulation layer 51 facing downward, is secured to the flat side of the insulation layer 47 on the bus bar 45 by a conductive epoxy layer 53 which also serves as the common plate for first and second capacitors 55 and 57 of capacitive divider 59 in which the bus bar 45 and the plate 49 respectively form the other plates This common plate 53 is connected to voltmeter 27 through terminal 61 and lead 63. The plate 49 is grounded through terminal 65.

Figure 6:
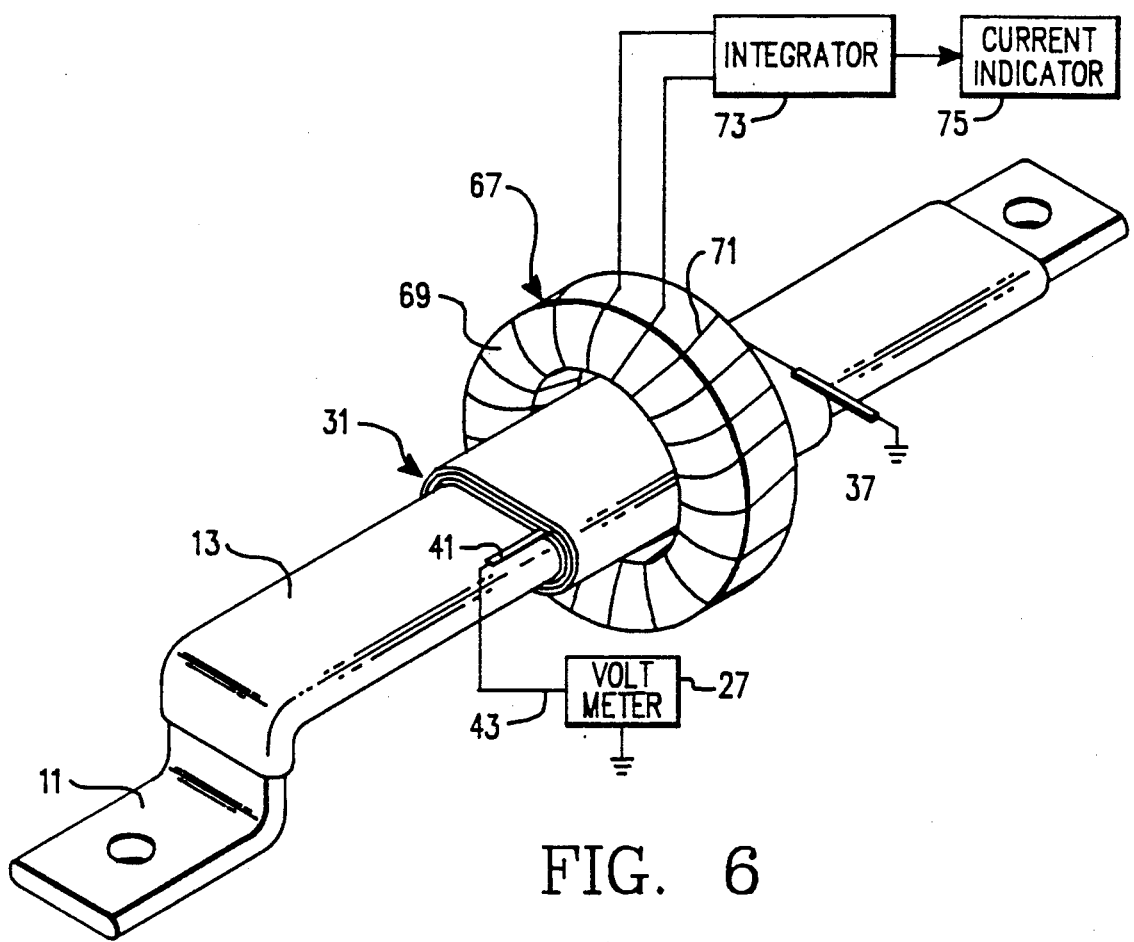
FIG. 6 is an isometric view of yet another embodiment of the invention which includes both voltage and current measuring apparatus.

FIG. 6 illustrates an embodiment of the invention which combines a voltage and current sensor. The voltage sensor portion comprises the capacitive divider 31 of the embodiment of the invention of FIGS. 3 and 4 in which the two capacitors are integrally formed on the bus bar 11. As in the voltage measuring device of FIGS. 3 and 4, the common plate of the two capacitors is connected to the voltmeter 27 through terminal 41 and lead 43, while the outer conductive layer 37 is grounded The current sensor comprises a mutual inductor 67 through which the bus bar passes. In the exemplary embodiment of the invention, the mutual inductor 67 has a toroidal low permeability core 69 on which the secondary winding 71 is wound. The bus bar 11 passing through the toroidal core 69 forms a one turn primary winding. As is known, such mutual inductors generate a voltage across the secondary winding which is proportional to the derivative of the current in the primary winding, in this case, the current in the bus bar 11. This secondary voltage is applied to an integrator 73 to produce a signal proportional to the current in the bus bar. This output of the integrator 73 is applied to a current indicating device 75.

As previously mentioned, the mutual inductor must be shielded to minimize the voltage effects on the current reading. It is known to provide a shield in the form of a grounded conductive layer on the bus bar insulation layer to provide this shielding. In the embodiment of the invention shown in FIG. 6, the grounded second conductive layer 37 which forms the second plate of the integral capacitive divider 31, also serves as the shield for the mutual inductor 67. This produces a very compact, low cost, reliable combined voltage and current sensor which can easily be retrofit to existing installations.

Figure 7:
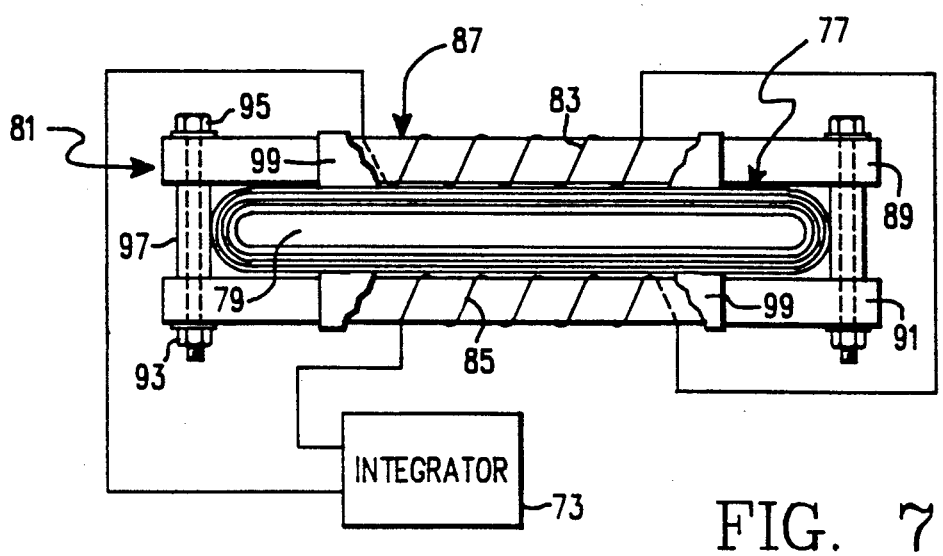
FIG. 7 is an end view of still another embodiment of the invention combining voltage and current sensing apparatus.

For the flat wide bus bars, an air core mutual inductor such as shown in FIG. 7 can be used as the current sensor In this embodiment of the invention, the integral capacitive divider 77 encircles the flat bus bar 79. A frame 81 of non-magnetically permeable material forms an air core on which two serially connected halves 83 and 85 of the coil of mutual inductor 87 are wound. In the example, the frame 81 includes two winding support members 89 and 91 clamped at the ends by nuts 93 and bolts 95 with spacers 97 setting the gap between the winding support members. An example of a non-magnetically permeable material suitable for frame 81, including support members 89 and 91, nuts 93, bolts 95, and spacers 97, is one consisting essentially of thermoplastic poly(methyl methacrylate)-type polymers commercially available under the trademark Plexiglas. Additional shielding can be provided by copper foil 99 wrapped around the windings 83 and 85 (shown broken away in FIG. 7). A gap (not shown) is left in the copper foil facing away from the bus bar.

Examples of the voltage measuring apparatus of the invention were constructed using a standard panel board bus bar measuring 0.25 inches×6 inches×34 inches for the flat bus bar shown in FIGS. 5 and 7, and a 0.5 inch×1 inch×13 inch bus bar from a contactor assembly for the smaller bus bar such as shown in FIGS. 2-4 and 6. The insulation layer applied to both bus bars was a coating of Hy-Sol DK-19 Red epoxy. The bars were preheated to 204 degrees C. (400 degrees F.) before dipping in the epoxy and were post-dip cured for 16 minutes at the same temperature resulting in a thickness for the first insulation layer of about 0.05 inches. The second plate of the first capacitor was formed by applying a coating of Acheson Electrodag 504. In both cases, the width of the coating was 2 inches. The single capacitor formed on the wide bus bar had a capacitance of 355 pF and on the narrower bus bar a capacitance of 90 pF.

In order to obtain the thin insulation layers required for the second coating, the epoxy was ground to a fine powder and electrostatically sprayed on to produce a second insulation layer having a thickness of about 2.5 mils, or about one-twentieth of the thickness of the first insulation layer.

While specific embodiments of the invention have been described in detail, it will be appreciated by those skilled in the art that various modifications and alternatives to those details could be developed in light of the overall teachings of the disclosure. Accordingly, the particular arrangements disclosed are meant to be illustrative only and not limiting as to the scope of the invention which is to be given the full breadth of the appended claims and any and all equivalents thereof.

What is claimed is:

1. Apparatus for measuring a voltage relative to ground, comprising:
   a bus bar;
   a first electrical insulation layer on said bus bar;
   a first electrically conductive layer on a portion of said first electrical insulation layer;
   said bus bar, said bus bar electrical insulation layer, and said first electrically conductive layer forming a first capacitor;
   an additional electrical insulation layer over said first electrically conductive layer and a second electrically conductive layer disposed over said additional electrical insulation layer such that a second capacitor is formed by said first and second electrically conductive layers having said additional electrical insulation layer disposed therebetween, the first and second capacitors forming a capacitive divider in which the voltage across said second capacitor is proportional to the voltage between the bus bar and ground;
   wherein said first and second capacitors are disposed in fixed relation relative to one another and to said bus bar; and
   wherein said first electrical insulation layer and said additional electrical insulation layer are each formed of the same dielectric material and said electrical insulation layer is selectively disposed on said bus bar in a predetermined area relative to said first electrically conductive layer.

2. The apparatus of claim 1 wherein said first electrical insulation layer has a thickness which is at least an order of magnitude greater than the thickness of said additional electrical insulation layer.

3. The apparatus of claim 2 wherein the thickness of said first electrical insulation layer is about twenty times greater than the thickness of said additional electrical insulation layer.

4. The apparatus of claim 1 wherein said first electrically conductive layer and said second electrically conductive layer extend over areas which are coextensive.

5. The apparatus of claim 1 wherein said second electrically conductive layer comprises an electrically conductive plate, wherein said additional electrical insulation layer is applied to said plate, and wherein said first conductive layer comprises a conductive adhesive which secures said plate with said additional electrical insulation layer thereon to said first electrical insulation layer.

6. Apparatus for measuring current and voltage relative to ground comprising:
   a bus bar through which the current flows at a certain voltage to be determined;
   a first insulation layer of a selected electrically insulating material on said bus bar;
   current sensing coil means through which said bus bar passes;
   a first electrically conductive layer on said first insulation layer adjacent said current sensing coil means shielding said current sensing coil means from the voltage on said bus bar, said bus bar, bus bar insulation layer and first electrically conductive layer forming a first capacitor;

an additional electrical insulation layer, of the same dielectric material as said first insulation layer disposed over said first electrically conductive layer and a second electrically conductive layer disposed over said additional electrical insulation layer such that a second capacitor is formed by said first and second electrically conductive layers having said additional electrical insulation layer disposed therebetween, said first and second capacitors forming a capacitive divider in which the voltage across the second capacitor is proportional to the voltage from the bus bar to ground;

wherein said first and second capacitors are disposed in fixed relation relative to one another and to said bus bar;

wherein said second electrically conductive layer associated with said second capacitor forms an electrical shield between said capacitive divider and said current sensor coil means; and means measuring voltage across the second capacitor and generating therefrom a representation of the voltage from the bus bar to ground.

7. The apparatus of claim 6 wherein said first and second electrically conductive layers extend over areas which are coextensive.

* * * * *